United States Patent
Hirose et al.

(10) Patent No.: US 6,480,707 B1
(45) Date of Patent: Nov. 12, 2002

(54) CHANNEL SELECTION APPARATUS

(75) Inventors: Koji Hirose, Osaka (JP); Ryuichi Sakai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/264,161

(22) Filed: Mar. 5, 1999

(30) Foreign Application Priority Data

Mar. 5, 1998 (JP) .......................................... 10-053235

(51) Int. Cl.[7] ................................................. H04B 1/18
(52) U.S. Cl. ................................ 455/179.1; 455/182.2; 455/185.1; 455/186.1; 348/731; 348/468
(58) Field of Search ........................... 455/182.3, 186.1, 455/190, 180.1, 179.1, 180.3, 187.3, 182.2, 154.1, 154.2; 348/725, 729, 731, 732, 734, 468, 465, 206, 466, 460

(56) References Cited

U.S. PATENT DOCUMENTS

| | | | | |
|---|---|---|---|---|
| 3,980,951 A | * | 9/1976 | Breeze et al. | 455/182.1 |
| 4,355,416 A | * | 10/1982 | Malerba | 455/186.2 |
| 4,725,886 A | * | 2/1988 | Galumbeck | 348/461 |
| 4,776,038 A | * | 10/1988 | Testin et al. | 455/182 |
| 5,051,829 A | | 9/1991 | Chang | |
| 5,393,713 A | * | 2/1995 | Schwob | 455/158.5 |
| 5,461,427 A | * | 10/1995 | Duffield et al. | 348/555 |
| 5,471,662 A | * | 11/1995 | Shiota | 455/166.1 |
| 5,617,151 A | * | 4/1997 | Lee | 348/731 |
| 5,625,422 A | * | 4/1997 | Kim | 348/731 |
| 5,701,599 A | * | 12/1997 | Aihara | 455/186.1 |
| 5,754,257 A | * | 5/1998 | Lee | 348/731 |
| 5,805,230 A | * | 9/1998 | Staron | 348/460 |
| 5,809,407 A | * | 9/1998 | Kasperkovitz et al. | 455/184.1 |
| 5,818,438 A | * | 10/1998 | Howe et al. | 345/327 |
| 5,819,166 A | * | 10/1998 | Kimura et al. | 455/186.1 |
| 5,959,700 A | * | 9/1999 | Arikane et al. | 348/731 |

FOREIGN PATENT DOCUMENTS

| | | |
|---|---|---|
| DE | 3145407 | 5/1983 |
| DE | 195 18 368 | 2/1996 |
| EP | 0050328 | 10/1981 |
| EP | 02105788 | 4/1990 |
| EP | 0724359 | 7/1996 |
| JP | 2-105788 | 4/1990 |

* cited by examiner

*Primary Examiner*—Dwayne Bost
*Assistant Examiner*—Joy K. Contee
(74) *Attorney, Agent, or Firm*—RatnerPrestia

(57) ABSTRACT

A channel selection apparatus for sorting broadcast signals detects parity errors of plural broadcast signals transmitted from the same broadcasting station. The tuned frequency of the broadcast signal is shifted from the frequency of a normal broadcast signal by a predetermined value. As a result, field intensity of the broadcast signal correlates more closely with a parity error rate. The channel selection apparatus thus can sort broadcast signals in the order of fewer error rates and assign them to tuning buttons in the order of easier selecting operation.

8 Claims, 3 Drawing Sheets

CHANNEL SELECTION APPARATUS

FIELD OF THE INVENTION

The present invention relates to a channel selection apparatus employed in a television receiver (TV) or a video cassette recorder (VCR), and more particularly to a channel selection apparatus that automatically receives all the broadcast signals available in a given local area while identifying their station names. The channel selection apparatus then sorts the signals in a given order, and has tuning buttons to store the signals in the given order.

BACKGROUND OF THE INVENTION

FIG. 3 is a block diagram illustrating a sorting technique of a channel selection apparatus already commercialized and employed in TVs and VCRs. The channel selection apparatus comprises the following elements:

(a) tuning section 31 for selecting a broadcast signal from antenna (b) tuning voltage generator 32 for supplying a tuning voltage to tuning section 31 in order to receive a desired channel;

(c) broadcast signal detector 37 for determining availability of broadcast signals on a tuned frequency;

(d) text signal detector 33 for detecting text signals for identifying a broadcasting station associated with the broadcast signal detected by signal detector 37;

(e) error detector 35 for counting within a given time the number of parity errors of specified data from text signals of the broadcast signals received by tuning section 31;

(f) memory 34 for storing the frequencies of broadcast signals received by tuning section 31 and the names of broadcasting stations identified by detector 33;

(g) sorter 36 for (1) re-tuning the station stored in memory 34, the station having different frequencies, then (2) arranging the broadcast signals in the order of fewer parity errors based on the data supplied from error detector 35, and (3) assigning the arranged signals to the tuning buttons in the order of easier selecting operation.

The construction discussed above allows the channel selection apparatus to assign the frequencies of broadcasting stations of each state or each local area in a specified order to the tuning buttons of TVs or VCRs and to store these stations in the buttons. In other words, if a station has a plurality of on-air frequencies, the arrangement of stored frequencies can be changed so that the frequency containing fewer parity errors can be stored to the tuning button for easier selection. When the field intensities of both the broadcast signals to be compared are strong enough, a visual check can hardly distinguish the picture quality of both the signals. It is therefore possible to assign the broadcast signal having a text signal with a higher parity error rate to a tuning button for easier selection. The foregoing structure can avoid the problem discussed above.

When receiving a broadcast signal with a field intensity having sufficient strength, this structure, however, is rarely subjected to parity errors. The correlation between field intensity and parity-error-rate, however, is not always constant. In other words, correlation among picture quality by visual inspection, parity-error-rate and field intensity is not always constant in a practical use because of the following reason. Since both of the broadcast signals are subject to few errors in a steady state, an error in a non-steady state, such as a burst error due to noise disturbance, could influence both of the signals. Therefore, sorting a plurality of broadcast signals transmitted from the same station by a visual check does not always arrange the signals with fewer parity errors in the order of easier selecting operation.

Further, German Patent No. DE195 18 368 C1 discloses the following technique about determining the strength of a television signal based on a quality of a received teletext-signal out of broadcast signals. In order to evaluate strength of received broadcast signals including teletext information, a non-time-varied part is selected from the teletext signals, and this part is compared over a plurality of times. The broadcast signals are evaluated based on a number of different points of the comparison results. This German patent still has the same problem as discussed previously, i.e. since few errors are expected in a steady state under a practical field intensity, the comparison result is not always correct.

SUMMARY OF THE INVENTION

The present invention addresses the problem discussed above, and aims to provide a channel selection apparatus that can provide reliable sorting. A channel selection apparatus of the present invention includes the following steps to store a broadcast signal having the fewest parity errors by priority in a tuning button for an easier selecting operation. First, store in pairs into a memory all the names of the broadcasting stations and the corresponding frequencies available in the area where the channel selection apparatus is operated. Second, detect the broadcast signals having different frequencies under the same station name from the memory. Individually receive the detected plural broadcast signals with RF frequencies that are shifted from the normal frequency by a predetermined value so that the field intensity thereof is intentionally lowered. Then, detect only text data from the received broadcast signals, and compare it with a state of high error rate. Calculate the parity error rate of specified data from the respective text data, and compare the parity error rates of the plural broadcast signals. Finally, store the broadcast signal having the lowest parity error rate with priority in a tuning button of an easier selecting operation. Repeat the foregoing procedure until all the stations that have a plurality of RF frequencies for each broadcast signal undergo the procedure.

The operation described above can be automated, or manually activated according to the desires of a user.

As such, the strength of receiving-field-intensity correlates more closely with the parity-error-rate. As a result, frequencies stored in the tuning buttons are re-sorted so that the frequency having the strongest field intensity and producing the best picture quality is assigned to and stored in the tuning buttons of easiest selecting operation.

DETAILED DESCRIPTION OF THE EXEMPLARY EMBODIMENTS

Operations of the channel selection apparatus of the present inventions are described hereinafter with reference to FIG. 1 and FIG. 2.

Exemplary Embodiment 1

Figure 1:
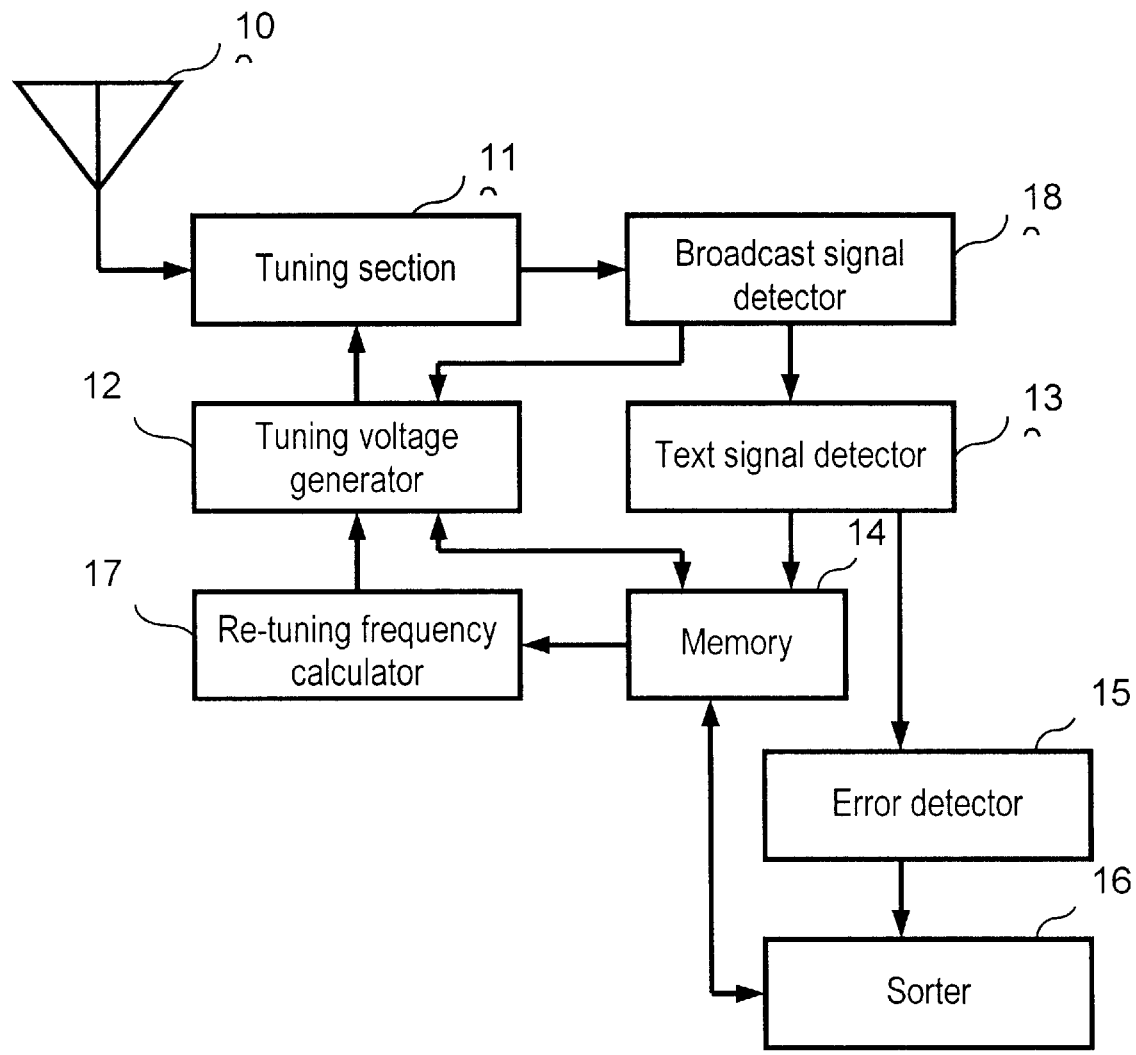
FIG. 1 is a block diagram of a channel selection apparatus in accordance with a first exemplary embodiment of the present invention.

FIG. 1 is a block diagram of a channel selection apparatus in accordance with the first exemplary embodiment of the present invention.

A tuning information supplier, such as tuning voltage generator 12, produces a scanning voltage for tuning section 11, which, in turn, scans all frequencies sequentially from a first channel to a last channel using the scanning voltage. Tuning section 11 incorporates a voltage-controlled oscillator. The output frequency of the oscillator is changed by changing the scanning voltage.

When the tuning frequencies are varied sequentially as described above, the tuning section outputs a broadcast signal at the agreement of the scanning voltage with a tuning voltage corresponding to the frequency of the RF broadcast signal received by antenna 10. Broadcast signal detector 18 detects the signals tapped off from the tuning section 11, and halts the voltage scanning while retaining the voltage. Text signal detector 13 extracts text signals from the detected broadcast signals, then identifies names of broadcasting stations using the text signals, and outputs the names to memory 14. When the channel selection apparatus employs a frequency synthesizing oscillator using a PLL (phase locked loop), the same result can be obtained by changing parameters in the counter instead of changing the scanning voltage.

Memory 14 reads the frequency retained by tuning voltage generator 12, and stores in memory 14 a set of three elements, i.e. the name of the broadcasting station, the position of the button selecting the station, and the RF frequency. After storing all of these elements in one set, scanning is resumed with a micro controller (not shown). When broadcast signal detector 18 detects another broadcast signal, the same procedure is repeated in order to store the frequency and corresponding station name.

TABLE 1

| Position | names of broadcast station | RF frequency of broadcasting signal |
|---|---|---|
| 1 | AAA | 100 MHz |
| 2 | BBB | 120 MHz |
| 3 | CCC | 140 MHz |
| 4 | DDD | 160 MHz |
| — | — | — |
| — | — | — |
| 32 | AAA | 240 MHz |
| — | — | — |
| — | — | — |

The same process is repeated until the last channel is scanned and a tuning data shown in Table 1 is stored in memory 14. In the tuning data table, sets of a position of the tuning button, the name of the station and the corresponding frequency are stored. Thus, the table lists every broadcast signal area.

The table can be stable can be utilized in an ordinary channel selection process. Tuning voltage generator 12 recognizes a frequency of the position instructed through a tuning button of a TV, VCR, or a remote controller thereof. Then generator 12 supplies a tuning voltage corresponding to the RF frequency to tuning section 11. Thus, a broadcast signal of a desired station can be received and tuned.

Sorting of the tuning data table is described hereinafter. When the table is completed, the micro-controller automatically starts sorting.

Sorter 16 retrieves the broadcast frequencies having different values under one station name from the first line to the bottom last line in the table. After the retrieval, the microcontroller controls the following steps.

(a) Re-tuning frequency calculator 17 reads off a first frequency of the retrieved station from memory 14, calculates a frequency shifted by a predetermined value from the first frequency, and then outputs the shifted frequency to tuning voltage generator 12.

(b) Tuning voltage generator 12 supplies a tuning voltage corresponding to the instructed frequency to tuning section 11, which receives the first broadcast signal having the frequency shifted from the normal one.

(c) Tuning section 11 outputs the broadcast signal to text signal detector 13 via broadcast signal detector 18.

(d) Text signal detector 13 extracts text signals from the received broadcast signals, further extracts specified data from the text signals so as to calculate a parity error, and then sends the specific data to error detector 15.

(e) Error detector 15 counts the number of parity errors of the specified data within a given time, in order to calculate a parity error rate.

The parity error rate of the first frequency is thus obtained, and the parity error rate of the second frequency of the retrieved station can be obtained using the same procedure.

(f) Sorter 16 compares the two parity-error-rates thus obtained, moves the broadcast signal having a lower parity error rate to the first line of the tuning data table, and moves the signal having a greater parity error rate to the last line of the table.

(g) The same procedure is repeated for all remained broadcast signals.

More specific process of the sorting is described with reference to FIG. 2, which illustrates the sorting process in accordance with the first exemplary embodiment of the present invention.

Step 1 (S1): The microcomputer instructs sorter 16 to start sorting.

Step 2 (S2): Substitute "1" and "2" respectively into "n" and "m" which indicate positions in the tuning data table.

Step 3 (S3): Sorting section 16 reads off the station name at position "n" from the tuning data table.

Step 4 (S4): Sorting section 16 further reads off the station name at position "m" from the tuning data table.

Step 5 (S5): Sorting section 16 checks whether these station names are the same or not. When they are not same, the process moves to Step 17 (S17) where "m" is replaced with "m+1" as new "m", then returns to Step 4, and repeats the same procedure until the same station is detected in Step 5.

Step 6 (S6): In the case of n=1 and m=32 in the table 1, the same station name is detected in Step 5, and re-tuning frequency counter 17 reads off frequency "fn" of position "n" from the table.

Step 7 (S7): Counter 17 calculates "fn−df", where "df" is a predetermined frequency, and tuning voltage generator 12 produces the tuning voltage corresponding to the frequency of "fn−df". As a result, tuning section 11 is tuned to this frequency.

Step 8 (S8): Error detector 15 counts a number (En) of parity errors detected within a given time after the channel selection apparatus is tuned.

Step 9 (S9): Re-tuning frequency calculator 17 reads off frequency "fm" of position "m" from the table.

Step 10 (S10): Counter 17 calculates "fm−df", and tuning voltage generator 12 produces the tuning voltage corresponding to the frequency. As a result, tuning section 11 is tuned to the frequency of "fm−df".

Step 11 (S11): Error detector 15 counts a number (Em) of parity errors.

Step 12 (S12): Error detector 15 compares Em and En.

Step 13 (S13): When the comparison in Step 12 proves that En is greater than Em, position "n" has a higher parity error rate. Sorter 16 thus moves all the data in position "n" of the table to the last line, and moves all the data in position "m" to the position "n" instead.

Step 14 (S14): When Em is greater than En, all the data in position "m" are moved to the last line of the table. The more reliable frequency is thus moved to the upper line of the table.

Step 15 (S15): Sorter 16 determines whether "m" moves down to the last line of the table or not. If not, the process moves to Step 17 (S17) where "m" is replaced with "m+1" as new "m", and then the step repeats the same procedure from Step 4 and onward.

Step 16 (S16): When "m" arrived at the last line of the table, i.e. maximum numbered channel, sorter 16 determines whether "n" moves down to the last line of the table or not. If not, the process moves to Step 18 (S18) where "n" is replaced with "n+1" as new "n", and further, "m" is replaced with "new 'n'+1" as new "m". Then the process repeats the same procedure from Step 3 and onward.

Step 19 (S19): When sorter 16 determines that "n" arrives at the last line of the table, the process ends.

In the case where the table lists a plurality of the same stations, the list order may be arranged so that the channel having a higher reliability, in other words, the broadcast signal with a lower parity-error-rate is assigned to the tuning button of easier selecting operation upon completion of the foregoing process. The parity error rate is counted for the received-broadcast-signal having a frequency shifted by a specified value.

TABLE 2

| names of broadcast station | RF frequency of Broadcasting signal (fc) | Field intensity | Numbers of parity error at each frequency | | |
|---|---|---|---|---|---|
| | | | fc − df | fc | fc + df |
| AAA | 100 MHz | Strong | 0 | 0 | 0 |
| AAA | 240 MHz | Weak | 30 | 0 | 50 |

In step 7 and step 10, frequencies "fn" and "fm" are detuned by "df" The reason for this detuning is described hereinafter with reference to table 2. Table 2 lists the same stations named "AAA" that have different RF frequencies "fc" of broadcast signals. The numbers of parity errors responsive to different field intensities are put in the table 2. The parity error indicates "0" at the broadcast signal frequency "fc" regardless of the field intensities. When the broadcast signal frequency "fc" is detuned to be lowered or raised by a predetermined value "df", the number of parity errors detected remains as "0" in a strong field intensity; however, it indicates as high as 30 or 50 in a weak field intensity. The strength of receiving field intensity correlates more closely with the parity error rate when "fc" detuned by "df" is received than when the normal "fc" is received.

The predetermined frequency value "df" can be varied depending on a radio wave situation, whereby more reliable sorting can be achieved.

Figure 2:
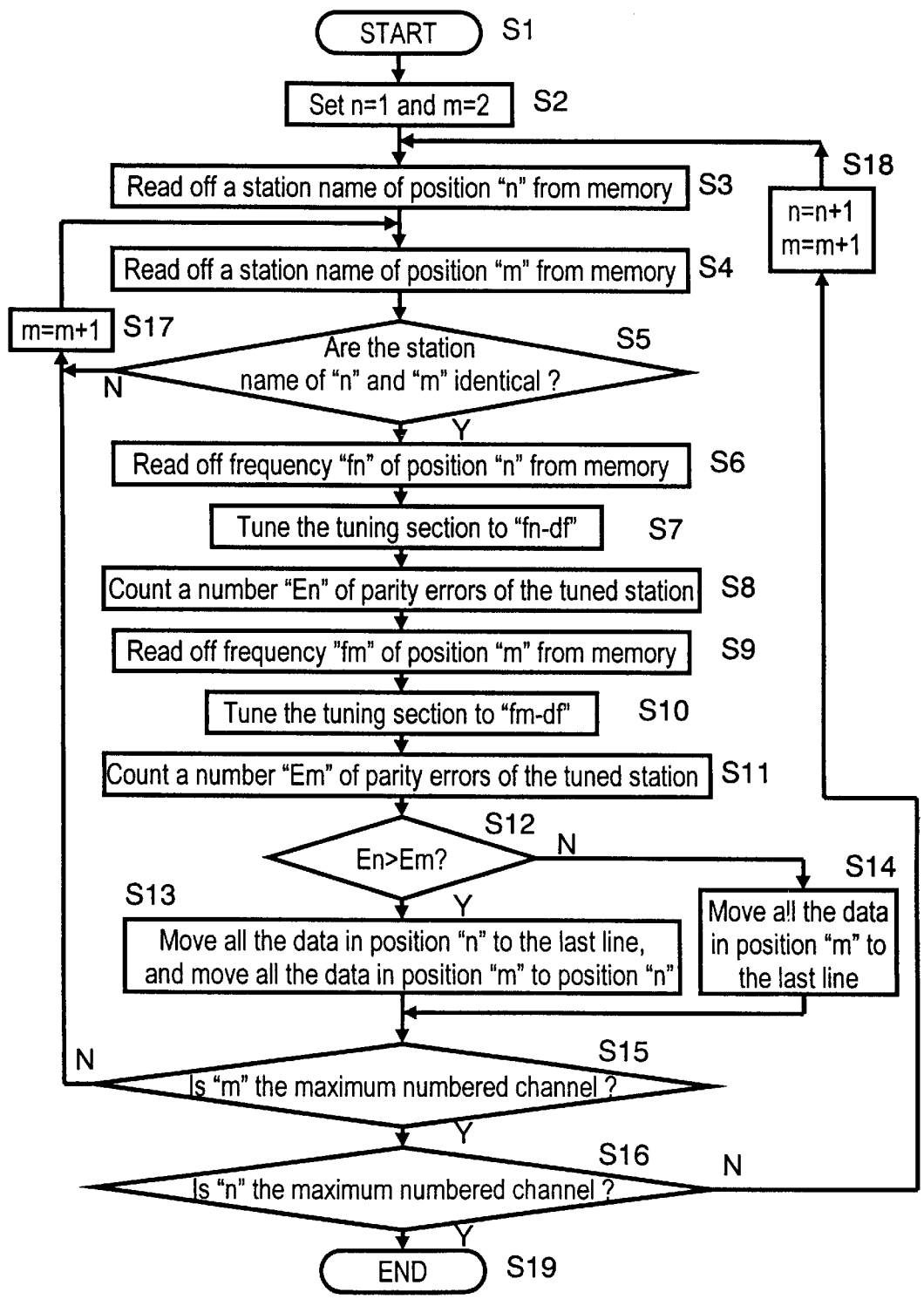
FIG. 2 is a flowchart illustrating a sorting process in accordance with the first exemplary embodiment of the present invention.
Figure 3:
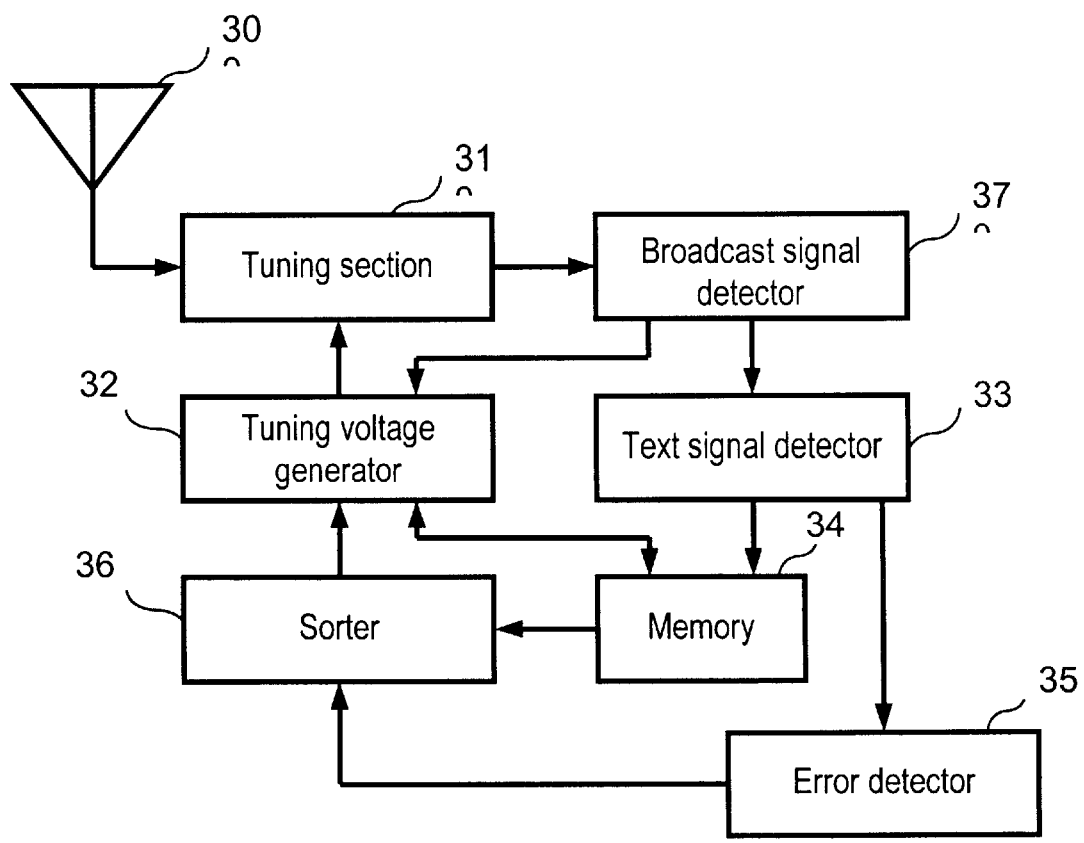
FIG. 3 is a block diagram of a conventional channel selection apparatus.

The process of FIG. 2 only handles the frequency lowered by "df", however, the frequency raised by "df" can also produce the same effect.

The function of broadcast signal detector 18 can be incorporated into tuning voltage generator 12 so that detector 18 can be eliminated.

As such, according to the first exemplary embodiment, the correlation between the receiving-field-intensity and the parity error is improved through shifting a tuned frequency from a frequency of normal broadcast signal by a predetermined value. As a result, sorting reliability is improved, thus a channel of higher reliability can be assigned to a tuning button having a smaller number that is placed at the most convenient place for tuning. In other words, the more reliable channel can be stored in the tuning button of easier selecting operation.

Exemplary Embodiment 2

The foregoing first exemplary embodiment stores all receivable station names and the corresponding frequencies into memory 14, then moves to automatically sort under microcomputer control. The channel selection apparatus in accordance with the second exemplary embodiment of the present invention can determine whether the sorting is activated or not depending on to the broadcast signals. Whenever sorter 16 identifies the frequency having fewer parity errors, the microcomputer displays the frequency or its channel number on a display and awaits an instruction whether the sorting is performed or not. When the instruction of "sort" is given from an external source, sorter 16 re-writes the tuning data table in memory 14. When the instruction "skip" is given, sorter 16 moves to the next frequency listed in the sorting table. This process can avoid missing a reception of the broadcast signal, when the same station has different frequencies having different on-air times on the same program.

Although the invention is illustrated and described herein, the invention is not intended to be limited to the details shown. Rather, various modifications may be made in the details within the scope and range of equivalents of the claims and without departing from the invention.

What is claimed is:

1. A method of signal selection, said method comprising the steps of:

scanning arrange of frequencies;

identifying in a list a plurality of signals detected within said range of frequencies; and exchanging one and another of two of said signals which correspond and which are in said list based on said one of said signals after being frequency offset having a lower error rate than said another of said signals after being frequency offset.

2. A method of signal selection according to claim 1, further comprising the step of identifying said two of said signals by determining that said two of said signals are related.

3. A method of signal selection according to claim 1, wherein said two of said signals are frequency offset by a corresponding amount.

4. A method of signal selection according to claim 1, wherein said plurality of signals are text parity signals and said error rates are text parity error rates.

5. Apparatus for signal selection, comprising:
- a scanner for scanning a range of frequencies;
- an error rate detector for detecting error rates of a plurality of signals scanned by said scanner;
- a memory unit in which a list of said plurality of signals is sorted based on respective error rates of said plurality of signals;
- a tuning unit for offsetting frequencies of said plurality of signals; and
- a sorter for exchanging one and another of two of said signals in said list based on said one of said signals after being frequency offset having a lower error rate than said another of said signals after being frequency offset.

6. Apparatus of claim 5, wherein said sorter identifies said two of said signals by determining that said two of said signals are related.

7. Apparatus of claim 5, wherein said tuning unit offsets frequencies of said two of said signals by a corresponding amount.

8. Apparatus of claim 5, further comprising a text signal detector and an error detector for detecting said error rates, wherein said error rates are text parity error rates.

* * * * *

UNITED STATES PATENT AND TRADEMARK OFFICE
CERTIFICATE OF CORRECTION

PATENT NO.   : 6,480,707 B1
DATED        : November 12, 2002
INVENTOR(S)  : Hirose et al.

It is certified that error appears in the above-identified patent and that said Letters Patent is hereby corrected as shown below:

Column 6,
Line 50, "arrange" should read -- a range --.

Signed and Sealed this

Tenth Day of June, 2003

JAMES E. ROGAN
*Director of the United States Patent and Trademark Office*